(12) United States Patent
Johansson

(10) Patent No.: US 9,491,390 B2
(45) Date of Patent: Nov. 8, 2016

(54) METHOD AND SYSTEM FOR IMPLEMENTING CORRELATED MULTI-SAMPLING WITH IMPROVED ANALOG-TO-DIGITAL CONVERTER LINEARITY

(71) Applicant: OMNIVISION TECHNOLOGIES, INC., Santa Clara, CA (US)

(72) Inventor: Robert Johansson, Oslo (NO)

(73) Assignee: OmniVision Technologies, Inc., Santa Clara, CA (US)

( * ) Notice: Subject to any disclaimer, the term of this patent is extended or adjusted under 35 U.S.C. 154(b) by 169 days.

(21) Appl. No.: 14/555,062

(22) Filed: Nov. 26, 2014

(65) Prior Publication Data

US 2016/0150173 A1 May 26, 2016

(51) Int. Cl.
| | | |
|---|---|---|
| H04N 5/378 | (2011.01) | |
| H04N 5/357 | (2011.01) | |
| H03M 1/06 | (2006.01) | |

(52) U.S. Cl.
CPC ........... *H04N 5/378* (2013.01); *H03M 1/0634* (2013.01); *H04N 5/3575* (2013.01)

(58) Field of Classification Search
CPC . H04N 5/378; H04N 5/3575; H03M 1/0604; H03M 1/0607; H03M 1/0634; H03M 1/0641
See application file for complete search history.

(56) References Cited

U.S. PATENT DOCUMENTS

| | | | | |
|---|---|---|---|---|
| 2008/0218393 | A1* | 9/2008 | Kuramochi | ......... H03M 1/0643 341/143 |
| 2013/0113639 | A1* | 5/2013 | Thomas | .............. H03M 1/0673 341/131 |
| 2014/0183333 | A1* | 7/2014 | Johansson | .............. H04N 5/378 250/208.1 |
| 2015/0229859 | A1* | 8/2015 | Guidash | ................. H04N 5/374 348/308 |
| 2015/0236712 | A1* | 8/2015 | Okura | .................... H04N 5/378 250/208.1 |

\* cited by examiner

*Primary Examiner* — Daniel M Pasiewicz
(74) *Attorney, Agent, or Firm* — Blakely Sokoloff Taylor & Zafman LLP

(57) ABSTRACT

A method of implementing Correlated Multi-Sampling (CMS) in an image sensor with improved analog-to-digital converter (ADC) linearity starts with an ADC circuitry included in a readout circuitry that generates a plurality of uncorrelated random numbers used as a plurality of ADC pedestals for sampling image data. A Successive Approximation Register (SAR) included in the ADC circuitry stores a different one of the ADC pedestals before each sampling of the image data. The ADC circuitry samples an image data from a row a plurality of times against plurality of ADC pedestals to obtain a plurality of sampled input data. The ADC circuitry converts each of the plurality of sampled input data from analog to digital, which includes performing a binary search using the SAR. Other embodiments are also described.

22 Claims, 5 Drawing Sheets

METHOD AND SYSTEM FOR IMPLEMENTING CORRELATED MULTI-SAMPLING WITH IMPROVED ANALOG-TO-DIGITAL CONVERTER LINEARITY

FIELD

An example of the present invention relates generally to image sensors. More specifically, examples of the present invention are related to methods and systems for reading out image data from image sensor pixel cells, which include performing analog-to-digital conversion. Examples of the present invention include a method and a system for implementing correlated multi-sampling with improved analog-to-digital converter linearity.

BACKGROUND

High speed image sensors have been widely used in many applications in different fields including the automotive field, the machine vision field, and the field of professional video photography. The development of high speed image sensors is further driven by the consumer market's continued demand for high speed slow motion video and normal high-definition (HD) video that have a reduced rolling shutter effect.

In conventional complementary metal-oxide semiconductor ("CMOS") pixel cell, image charge is transferred from a photosensitive device (e.g., a photodiode) and is converted to a voltage signal inside the pixel cell on a floating diffusion node. The image charge can be readout from the pixel cell into readout circuitry and then processed. In conventional CMOS image sensors, the readout circuit includes an analog-to-digital converter (ADC). ADCs inherently suffer from non-linearity errors due to the particular architecture of each ADC. The non-linearity errors, which include the integral non-linearity (INL) and the differential non-linearity (DNL), cause the output of the ADC to deviate from the ideal output. For instance, the ideal output may be a linear function of the input.

Since these non-linearity errors are inherent to the ADCs, it is not possible to remove the effects of these errors by calibration. The negative effects of the non-linearity errors on the image sensor include a reduction of the dynamic range of the image charge (e.g., input signal) that may be processed by the readout circuitry's ADC as well as a reduction of the effective resolution of the ADC.

BRIEF DESCRIPTION OF THE DRAWINGS

The embodiments of the invention are illustrated by way of example and not by way of limitation in the figures of the accompanying drawings in which like references indicate similar elements throughout the various views unless otherwise specified. It should be noted that references to "an" or "one" embodiment of the invention in this disclosure are not necessarily to the same embodiment, and they mean at least one. In the drawings.

Figure 1:
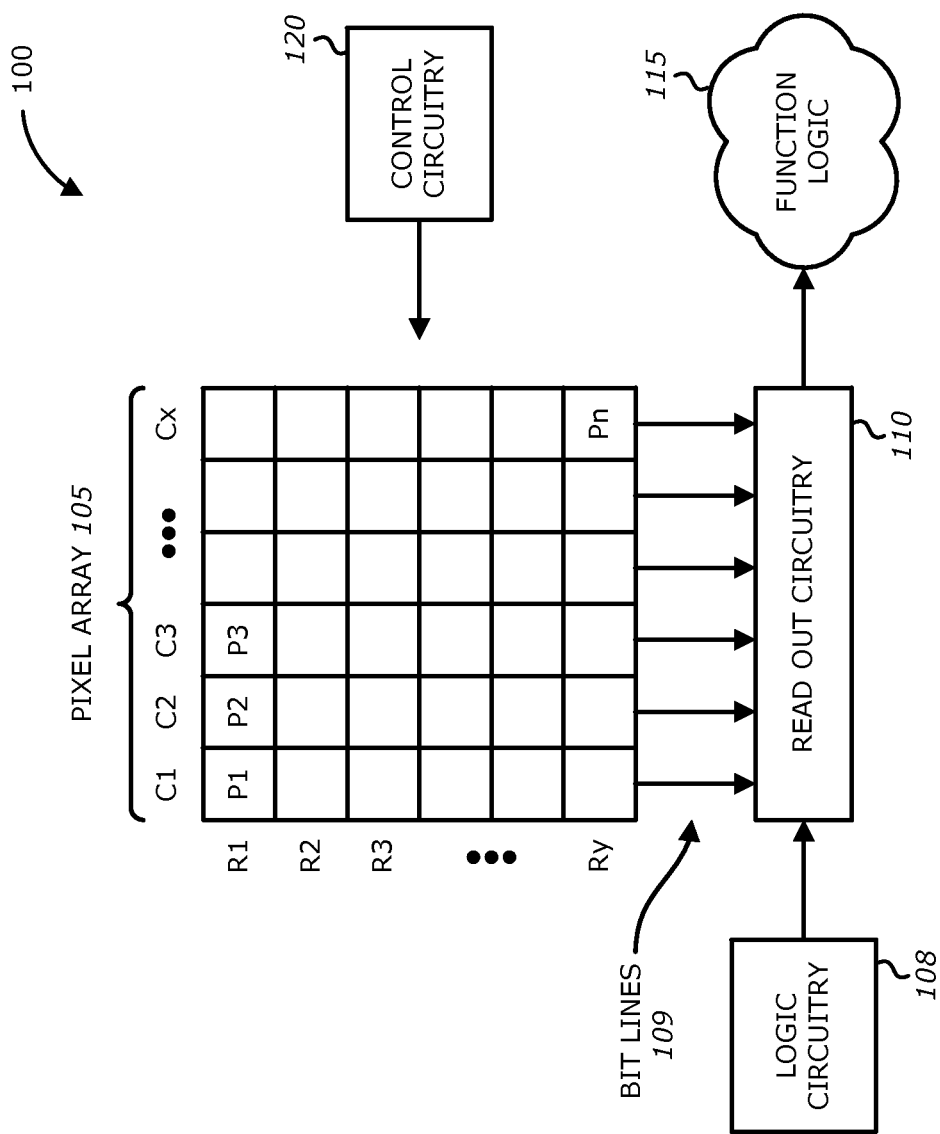
FIG. 1 is a block diagram illustrating an example imaging system including a readout circuitry that implements correlated multi-sampling with improved ADC linearity in accordance to one embodiment of the invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. However, it is understood that embodiments of the invention may be practiced without these specific details. In other instances, well-known circuits, structures, and techniques have not been shown to avoid obscuring the understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Particular features, structures or characteristics may be included in an integrated circuit, an electronic circuit, a combinatorial logic circuit, or other suitable components that provide the described functionality.

Examples in accordance with the teaching of the present invention describe an image sensor readout circuitry that implements Correlated Multi-Sampling (CMS) while reducing the non-linearity errors of the ADC circuitry included in the readout circuitry. In one example, the non-linearity errors of the ADC circuitry are reduced by oversampling (CMS) in addition to randomizing within the row time the ADC pedestal. The image sensor readout circuitry may compute and utilize the average of the errors for the multiple samples, thus reducing the non-linearity errors of the ADC circuitry in accordance with the teachings of the present invention.

FIG. 1 is a block diagram illustrating an example imaging system 100 that includes a readout circuitry 110 that implements correlated multi-sampling with improved ADC linearity in accordance to one embodiment of the invention. Imaging system 100 may be a complementary metal-oxide-semiconductor ("CMOS") image sensor. As shown in the depicted example, imaging system 100 includes pixel array 105 coupled to control circuitry 120 and readout circuitry 110, which is coupled to function logic 115 and logic control 108.

The illustrated embodiment of pixel array 105 is a two-dimensional ("2D") array of imaging sensors or pixel cells (e.g., pixel cells P1, P2, . . . , Pn). In one example, each pixel cell is a CMOS imaging pixel. As illustrated, each pixel cell is arranged into a row (e.g., rows R1 to Ry) and a column (e.g., columns C1 to Cx) to acquire image data of a person, place or object, etc., which can then be used to render an image of the person, place or object, etc.

In one example, after each pixel has acquired its image data or image charge, the image data is read out by readout circuitry 110 through readout column bit lines 109 and then transferred to function logic 115. In one embodiment, a logic circuitry 108 can control readout circuitry 110 and output image data to function logic 115. In various examples, readout circuitry 110 may include amplification circuitry (not illustrated), analog-to-digital conversion (ADC) circuitry 220, or otherwise. Function logic 115 may simply store the image data or even manipulate the image data by applying post image effects (e.g., crop, rotate, remove red eye, adjust brightness, adjust contrast, or otherwise). In one example, readout circuitry 110 may read out a row of image data at a time along readout column lines (illustrated) or may read out the image data using a variety of other techniques (not illustrated), such as a serial read out or a full parallel read out of all pixels simultaneously.

In one example, control circuitry 120 is coupled to pixel array 105 to control operational characteristics of pixel array 105. For example, control circuitry 120 may generate a shutter signal for controlling image acquisition. In one example, the shutter signal is a global shutter signal for simultaneously enabling all pixels within pixel array 105 to simultaneously capture their respective image data during a single acquisition window. In another example, the shutter signal is a rolling shutter signal such that each row, column, or group of pixels is sequentially enabled during consecutive acquisition windows.

Figure 2:
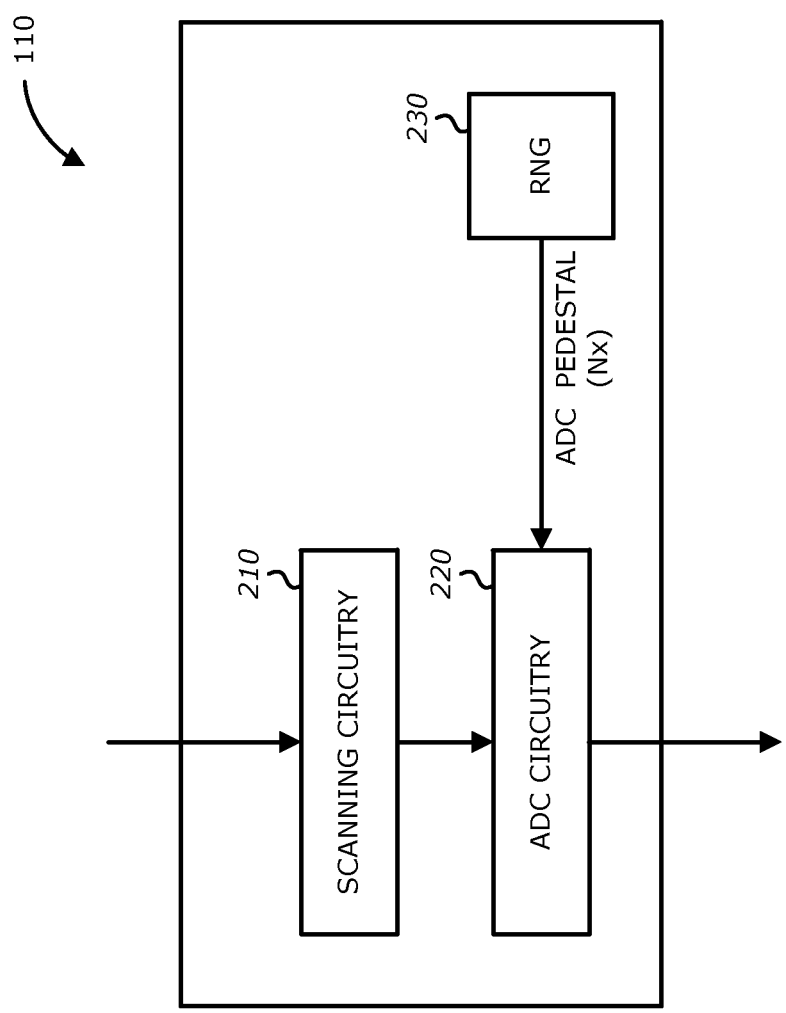
FIG. 2 is a block diagram illustrating the details of the readout circuitry in FIG. 1 in accordance to one embodiment of the invention.

FIG. 2 is a block diagram illustrating the details of readout circuitry 110 of an imaging system 100 in FIG. 1 that implements correlated multi-sampling with improved ADC linearity in accordance to one embodiment of the invention. As shown in FIG. 2, the readout circuitry 110 may include scanning circuit 210, an ADC circuitry 220, and a random number generator (RNG) 230. Scanning circuit 210 may include amplification circuitry, selection circuitry (e.g., multiplexers), etc. to readout a row of image data at a time along readout column bit lines 109 or may readout the image data using a variety of other techniques, such as a serial readout or a full parallel readout of all pixels simultaneously. The random number generator (RNG) 230 may be coupled to ADC circuitry 220 to generate random values to be used as the ADC pedestals (Nx). Using the random values, ADC circuitry 220 may sample image data from a row of the pixel array 105 against the random values used as an ADC pedestals.

Figure 3:
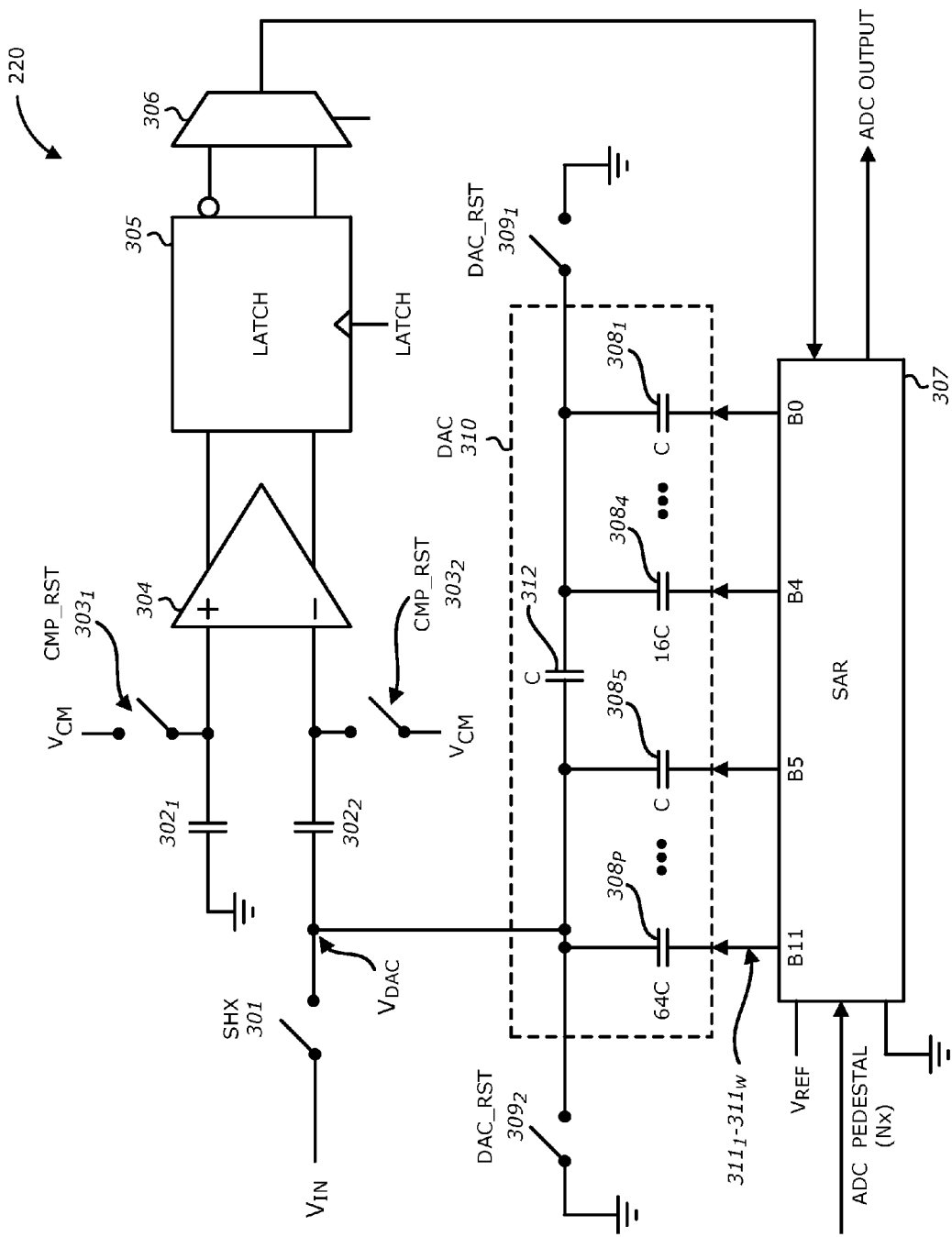
FIG. 3 is a block diagram illustrating the details of the ADC circuitry in FIG. 2 in accordance to one embodiment of the invention.

FIG. 3 is a block diagram illustrating the details of ADC circuitry 220 in FIG. 2 in accordance to one embodiment of the invention. While not illustrated, in some embodiments, a plurality of ADC circuitry 220 may be included in the readout circuitry 110. As shown in FIG. 3, ADC circuitry 220 includes a comparator 304 such as a fully differential op amp, a latch 305, a selector circuit 306 such as a multiplexer, a digital-to-analog converter (DAC) circuitry 310, and a Successive Approximation Register (SAR) 307. The ADC circuitry 220 also comprises plurality of switches including an input switch "SHX" 301, a pair of comparator reset switches "CMP_RST" $303_1$, $303_2$, and a pair of digital-to-analog converter (DAC) reset switches "DAC_RST" $309_1$, $309_2$. ADC circuitry 220 also comprises a plurality of DAC capacitors $308_1$-$308_p$ (p>1) that are included in the DAC circuitry 310 and a pair of comparator capacitors $302_1$, $302_2$ that are coupled to the inputs of comparator 304.

In one embodiment, as shown in FIG. 3, DAC circuitry 310 includes a plurality of DAC capacitors $308_1$-$308_p$ that are in parallel, and one capacitor 312 that is located between the front plates of two capacitors $308_4$, $308_5$ that are in parallel. The back plates of capacitors $308_1$-$308_p$ are respectively coupled to data output lines $311_1$-$311_w$ (w>1) of SAR 307. In some embodiments, SAR 307 includes twelve data output lines (e.g., w=12), respectively coupled to twelve parallel capacitors $308_1$-$308_p$ (e.g., p=12). DAC circuitry 310 is coupled to DAC reset switches "DAC_RST" $309_1$, $309_2$. Upon closing of DAC reset switches "DAC_RST" $309_1$, $309_2$, the front plates of DAC capacitors $308_1$-$308_p$ and both plates of DAC capacitor 312 are coupled to ground and thus, DAC circuitry 310 is reset. As further shown in FIG. 3, the input voltage $V_{IN}$ is received from scanning circuitry 210 and corresponds to the image data or image charge from a pixel in pixel array 105. Upon closing of the input switch "SHX", the input voltage $V_{IN}$ is measured at the node $V_{DAC}$ such that the input voltage $V_{IN}$ is received and acquired by capacitors $308_1$-$308_p$ in DAC circuitry 310.

In one embodiment, the inputs of comparator 304 are respectively coupled to comparator capacitors $302_1$, $302_2$ and comparator reset switches $303_1$, $303_2$. Upon closing comparator reset switches $303_1$, $303_2$, the inputs of comparator 304 as well as comparator capacitors $302_1$, $302_2$ are coupled to predetermined voltage $V_{CM}$. As shown in FIG. 3, comparator capacitor $302_1$ is coupled to ground whereas comparator capacitor $302_2$ is coupled to node $V_{DAC}$. In one embodiment, the comparator is reset during SHR1 in FIG. 4 (e.g., when $V_{IN}$ is equal to the pixel reset value), and the input signal $V_{IN}$ is sampled on DAC circuitry 310. In other words, after each conversion of the voltage input $V_{IN}$ (e.g., when all of the samples in the row have been converted), comparator 304 is reset by closing comparator reset switches "CMP_RST" $303_1$, $303_2$ such that the inverting input of comparator 304 coupled to comparator reset switch "CMP_RST" $303_2$ is set to the predetermined comparator voltage $V_{CM}$.

The outputs of comparator 304 are coupled to latch 305, which receives and stores the data being output from comparator 304. The outputs of latch 305 are coupled to selector circuitry 306, and the output of selector circuitry 306 is coupled to SAR 307. In one embodiment, one of the outputs of latch 305 is inverted. Accordingly, SAR 307 may receive an SAR input, which is a result (or output) of comparator 304 via latch 305 and selector circuitry 306.

SAR 307 is coupled to a voltage reference $V_{REF}$ (e.g., 1.0 V) and to ground, and controls DAC circuitry 310 by driving the back plates of DAC capacitors $308_1$-$308_p$ via data output lines $311_1$-$311_w$. For example, if first data output line $311_1$ (e.g., b0) is 0, then the back plate of DAC capacitor $308_1$ that is coupled thereto is connected to ground, and if first data output line $311_1$ is 1, then the back plate of DAC capacitor $308_1$ that is coupled thereto is connected to the voltage reference $V_{REF}$. SAR 307 is reset before each conversion of sampled input data (e.g., $V_{SHR1}$, $V_{SHR2}$, $V_{SHR3}$, $V_{SHR4}$, $V_{SHS1}$, $V_{SHS2}$, $V_{SHS3}$, $V_{SHS4}$). The sampled input data is obtained by the ADC circuitry sampling the image data from a given row that is being processed. SAR 307 in conjunction with DAC circuitry 310 perform a binary search and each bit in data output lines $311_1$-$311_w$ is set in succession from most significant bit (MSB) to least significant bit (LSB). In this embodiment, comparator 304 determines whether a bit in data output lines $311_1$-$311_w$ should remain set or be reset. At the end of the conversion, SAR 307 holds the ADC converted value (e.g., ADC output) of the sampled input data.

Referring to FIGS. 1 and 3, each of the elements of ADC circuitry 220 may be controlled by logic circuitry 108. In one example, logic circuitry 108 may transmit signals to control the timing of the opening and closing of switches "SHX" 301, "CMP_RST" $303_1$, $303_2$, "DAC_RST" $309_1$, $309_2$, as well as signals to control latch 305 and selector circuit 306, respectively. In one example, logic circuitry 108 generates and transmits the signals to control the switches as shown in the timing diagram of FIG. 4.

As an example, if the node $V_{DAC}$ had a value of V1 and SAR 307 includes 12 bits of storage and is storing a value equal to 0 (e.g., output lines $311_1$-$311_w$=B<11:0>=0x000), because DAC capacitors $308_1$-$308_p$ are binary coded, by sweeping through all the possible codes (from 0 to 4095) by SAR 307, the node $V_{DAC}$ would increase linearly from V1 to approximately V1+$V_{REF}$.

However, sampling the input voltage (signal) $V_{IN}$ on DAC circuitry 310 with SAR 307 being set to 0 (e.g., B<11: 0>=0x000) would have the negative effect of any noise, comparator 304 offset, or charge injection from switches 301, $303_1$, $303_2$, resulting in the input voltage signal $V_{IN}$ being clipped during the ADC conversion. This is due to the lowest output voltage of DAC circuitry 310 being obtained when the input of SAR 307 is set to 0. In one embodiment, to avoid this negative effect, the sampling of the input voltage signal $V_{IN}$ is performed against SAR 307 value (e.g., the ADC pedestal) that is higher than 0. As shown in FIG. 3, in one embodiment, SAR 307 may also be coupled to random number generator (RNG) 230 to receive random values that are used as the ADC pedestal (Nx). In some embodiments, random number generator 230 generates and transmits uncorrelated random numbers that may be uniformly distributed between 64 and 79 to SAR 307.

In some embodiments, outputs lines $311_1$-$311_w$ of SAR 307 are coupled to a multiplexer (not shown) that is controlled by logic circuitry 108 to set a pedestal value. In this embodiment, the contents of SAR 307 (e.g., $V_{SHR1}$) may be transferred to a readout memory (not shown) included in readout circuitry 110 during the sampling of the next value (e.g., $V_{SHR2}$, $V_{SHR3}$, $V_{SHR4}$, $V_{SHS1}$, $V_{SHS2}$, $V_{SHS3}$, $V_{SHS4}$).

Figure 4:
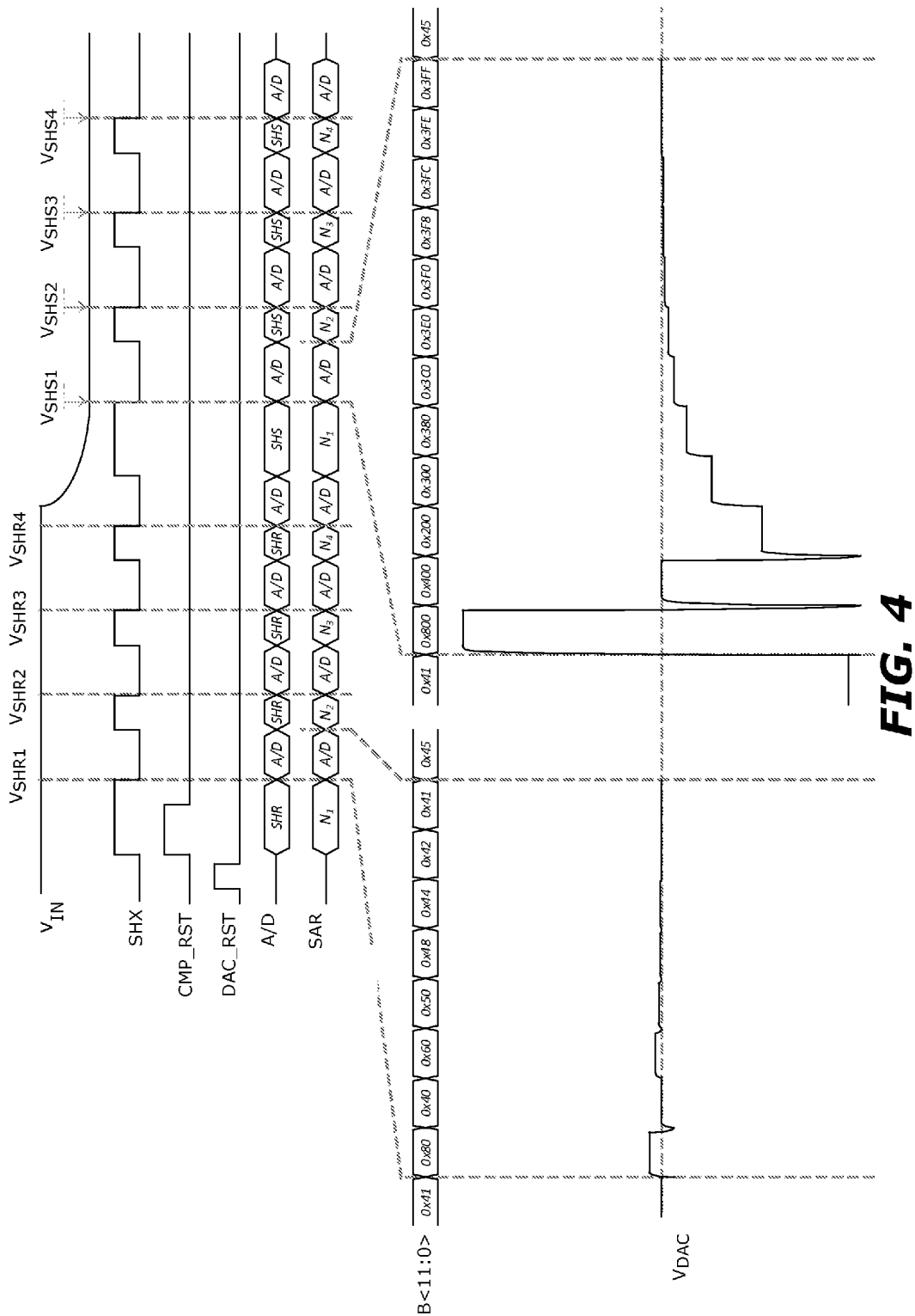
FIG. 4 illustrates a timing diagram of the input and output signals in the ADC circuitry in FIGS. 2 and 3 in accordance to one embodiment of the invention.

In this embodiment, because comparator 304 is reset during the SHR1 (e.g., when $V_{IN}$ is equal to the pixel reset value) in FIG. 4, and the voltage input signal $V_{IN}$ is sampled on DAC circuitry 310, the conversions of the $V_{SHR}$ sampled input values will result in values that are close to the value of the ADC pedestal. In this embodiment, the inverting input of comparator 304 is set to the predetermined voltage $V_{CM}$ after each conversion. In one embodiment, the 8-bit conversions are used for $V_{SHR}$ sampled input values while 12-bit conversions are used for the $V_{SHS}$ sampled input values.

In one embodiment, to reduce the non-linearity errors inherent to ADC circuits 220, ADC circuitry 220 uses Correlated Multi-Sampling (CMS) and uses an ADC pedestal that is randomized within the row time. In other embodiments, the ADC pedestals may also be randomized from row-to-row of the pixel array.

FIG. 4 illustrates a timing diagram of the input and output signals in ADC circuitry 220 in FIGS. 2 and 3 in accordance to one embodiment of the invention. As discussed above, logic circuitry 108 may transmit controls signals to the elements in ADC circuitry 220 such as switches "SHX" 301, "CMP_RST" $303_1$, $303_2$, and "DAC_RST" $309_1$, $309_2$ to correspond to the signals illustrated in the timing diagram of FIG. 4. Logic circuitry 108 may also transmit control signals to latch 305 and selector circuitry 306. In one embodiment, the correlated multi sampling (CMS) voltage $V_{CMS}$ is calculated as:

$$V_{CMS} = \frac{1}{M}\left(\sum_{i=1}^{M} V_{SHR}(i) - \sum_{i=1}^{M} V_{SHS}(i)\right)$$

In FIG. 4, the left portion of the timing diagram illustrates the ADC conversions of the $V_{SHR}$ values and the right portion of the timing diagram illustrates the ADC conversions of the $V_{SHS}$ values. In the example in FIG. 4, DAC circuitry 310 is reset (e.g., DAC_RST=1) before the next conversion (e.g., SHX=1) and comparator 304 is reset (e.g., CMP_RST=1) during the SHR1 (e.g., SHX=1). In the example in FIG. 4, there are four CMS samples (i.e., M=4; 4×CMS) such that four values for the ADC pedestal are used ($N_1$ to $N_4$). The ADC pedestal values for $N_1$ to $N_4$ are uncorrelated random numbers. In one embodiment, the values for $N_1$ to $N_4$ may be uniformly distributed between 64 and 79. As shown in FIG. 4, the sampling within a row (e.g., $V_{SHR1}$, $V_{SHR2}$, $V_{SHR3}$, $V_{SHR4}$ and $V_{SHS1}$, $V_{SHS2}$, $V_{SHS3}$, $V_{SHS4}$) is performed against SAR 307 with ADC pedestal values being $N_1$ to $N_4$. By randomizing the ADC pedestal values $N_1$ to $N_4$ and performing multiple sampling (e.g., 4×CMS as in FIG. 4), ADC circuitry 220 may average the linearity errors from each sampling, which results in improved ADC DNL and INL. Further, by improving the ADC linearity of ADC circuitry 220, the structural noise caused by the ADC is reduced. In some embodiments, the ADC pedestal values (e.g., $N_1$ to $N_4$) are further randomized from row-to-row of pixel array 105 to reduce vertical fixed pattern noise (VFPN).

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 5:
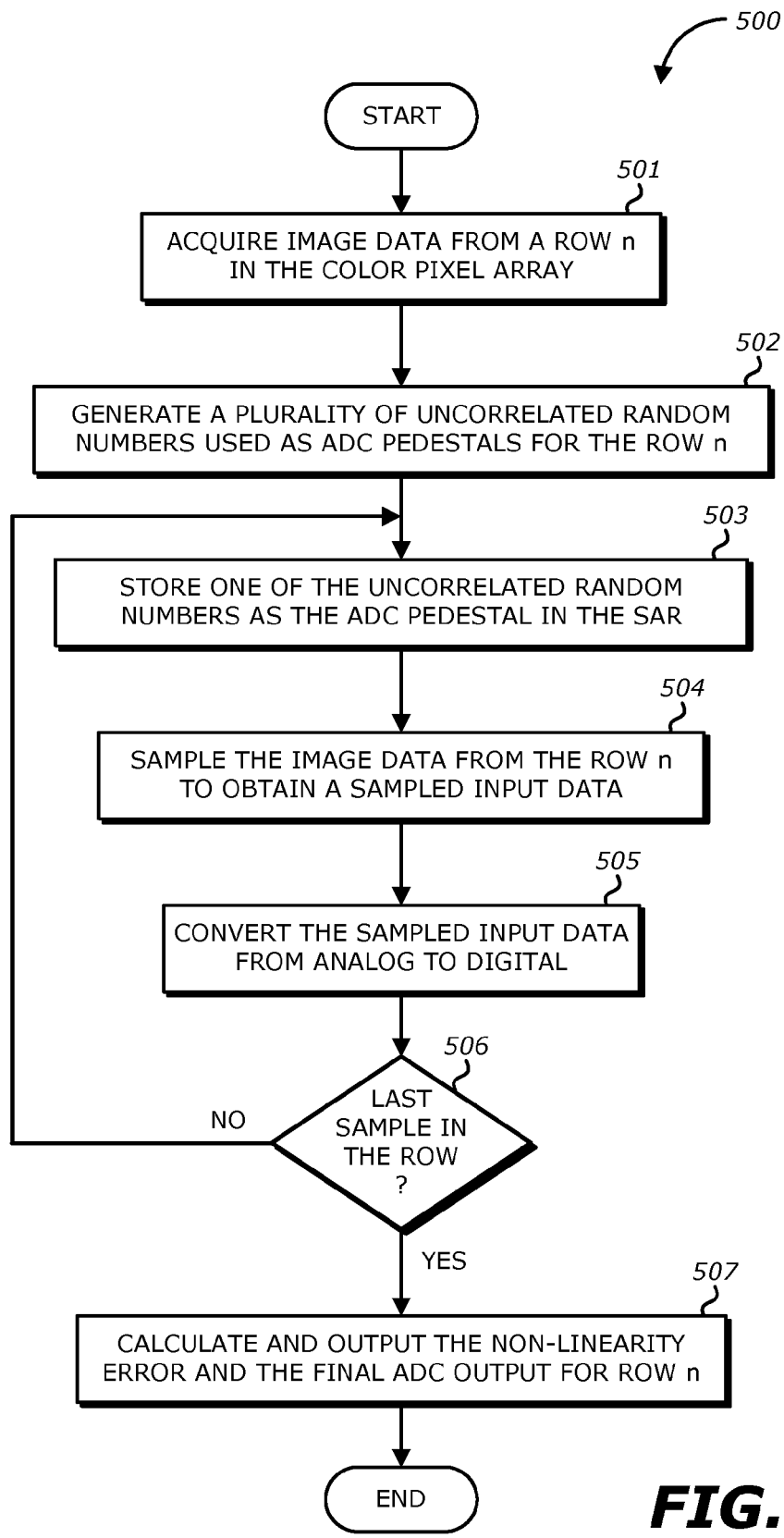
FIG. 5 is a flowchart illustrating a method of implementing correlated multi-sampling with improved analog-to-digital converter linearity in accordance to one embodiment of the invention.

FIG. 5 is a flowchart illustrating a method 500 of implementing correlated multi-sampling with improved analog-to-digital converter linearity in accordance to one embodiment of the invention. Method or process 500 starts with the readout circuitry acquiring an image data from a given row n in the color pixel array (block 501), where (n≥1). In one embodiment, the readout circuitry includes a scanning circuitry that selects and amplifies the image data from the given row n. The scanning circuitry may include at least one multiplexer to select the image and at least one amplifier to amplify the image data. The scanning circuitry may also transmit the image data that is selected and amplified to the ADC circuitry for further processing.

At block 502, an ADC circuitry included in the readout circuitry generates a plurality of uncorrelated random numbers to be used as ADC pedestals for the given row n. Accordingly, rather than having a single number being repeatedly used as an ADC pedestal for the same row, the values used as the ADC pedestal are randomized for the same row. In some embodiments, the uncorrelated random numbers are uniformly distributed between 64 and 79. At block 503, SAR included in the ADC circuitry stores one of the uncorrelated random numbers as the ADC pedestal and at block 504, the ADC circuitry samples the image data from the row n to obtain a sampled input data. In this embodiment, the ADC circuitry is sampling against the value stored in the SAR (e.g., a random number that is greater than 0x000). Referring back to FIG. 4, the uncorrelated random numbers used as ADC pedestals are: $N_1$, $N_2$, $N_3$, and $N_4$. In the example in FIG. 4, $N_1$ is 0x41 (or 65) and $N_2$ is 0x45 (or 69). In this example, the readout circuitry implements CMS with four samples (M=4). In one embodiment, the ADC circuitry samples the image data from the given row on a digital-to-analog (DAC) circuitry that is included in the ADC circuitry to obtain the sampled input data.

At block 505 in FIG. 5, the ADC circuitry converts from analog to digital the sampled input data to obtain an ADC output value. Accordingly, the ADC output value is the digitized value corresponding to the sampled input data. In some embodiments, converting the sampled input data from analog to digital includes performing a binary search using the DAC circuitry and the SAR that are both included in the ADC circuitry. The ADC circuitry may also include a comparator. In this embodiment, to perform the conversion of the sampled input data from analog to digital, the comparator determines whether to set or reset a plurality of bits stored in the SAR in succession from the MSB to the LSB, and the SAR sets or resets each of the plurality of bits stored therein based on the determination by the comparator. Once the LSB stored in the SAR is set or reset by the SAR, the value stored in the SAR is the ADC output value, which is a digitally converted value of the sampled input data. The ADC output value may then be outputted to a function logic or stored in a memory that is included in the readout circuitry. In one embodiment, the ADC circuitry's conversion of the sampled input data from analog to digital further includes resetting an inverting input of the comparator to a predetermined value (e.g., $V_{CM}$) during the sampling of the image data on the DAC circuitry to obtain the sampled input data. In this embodiment, the ADC circuitry further includes a latch coupled to the outputs of the comparator and a selector circuitry such as a multiplexer that is coupled to the outputs of the latch. The latch receives and stores the comparator output values and the selector circuitry selects the values output from the latch to be transmitted to the SAR.

At block 506, the ADC circuitry determines if other samples of input data are to be processed for the given row n. For instance, in the example in FIG. 4, the pairs of samples to be processed include: $V_{SHR1}$, $V_{SHR2}$, $V_{SHR3}$, $V_{SHR4}$, $V_{SHS1}$, $V_{SHS2}$, $V_{SHS3}$, and $V_{SHS4}$. In FIG. 4, once the sample $V_{SHR1}$ is converted from analog to digital to obtain the ADC output value and the SAR contains the ADC output value, the ADC circuitry may determine that other samples are to be processed for the row n (e.g., $V_{SHR2}$, $V_{SHR3}$, $V_{SHR4}$, $V_{SHS1}$, $V_{SHS2}$, $V_{SHS3}$, $V_{SHS4}$). If the ADC circuitry determines that the current sample that is converted is not the last sample in the row n at block 506, process 500 returns to block 503, where the SAR updates its contents and stores a different one of the uncorrelated random numbers as the ADC pedestal and at block 504, the ADC circuitry samples the image data from the row n against the updated value stored in the SAR. For instance, in FIG. 4, the SAR stores $N_2$ in lieu of $N_1$. Process 500 then continues to block 505, where the sampled input data is converted from analog to digital to generate another ADC output.

If, at block 506, the ADC circuitry determines that no other samples of input data are to be processed for the given row n, process 500 continues to block 507, the ACD circuitry calculates the non-linearity error and outputs the final ADC output for row n. In some embodiments, the ADC circuitry stores the ADC output values in a memory (not shown) that is included in the readout circuitry. To calculate the non-linearity error, the ACD circuitry may determine the INL and the DNL for each of the ACD outputs (e.g., each digitally converted sampled input data for the given row n) and compute the average of the INL and DNL errors for the row n. To output the final ADC output for the row n, the ADC circuitry may compute the CMS voltage $V_{CMS}$ using the equation:

$$V_{CMS} = \frac{1}{M}\left(\sum_{i=1}^{M} V_{SHR}(i) - \sum_{i=1}^{M} V_{SHS}(i)\right)$$

In other embodiments, the ADC circuitry outputs the ADC output values to a function logic to perform the non-linearity error and final ADC output for the row n computations. By randomizing the ADC pedestal within the row time and implementing CMS, the ADC non-linearity, including INL and the DNL, is reduced since the non-linearity errors are averaged. Process 500 may be repeated for each row in the color pixel array.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

The invention claimed is:

1. A method of implementing Correlated Multi-Sampling (CMS) in an image sensor with improved analog-to-digital converter (ADC) linearity, comprising:
   acquiring by a readout circuitry an image data from a first row in a color pixel array;
   generating by an ADC circuitry included in the readout circuitry a plurality of uncorrelated random numbers used as a plurality of ADC pedestals for the first row, the ADC pedestals including a first ADC pedestal and a second ADC pedestal;

storing by a Successive Approximation Register (SAR) included in the ADC circuitry the first ADC pedestal;
sampling by the ADC circuitry the image data from the first row against the first ADC pedestal stored in the SAR to obtain a first sampled input data; and
converting by the ADC circuitry the first sampled input data from analog to digital to obtain a first ADC output value;
once the first ADC output value is obtained,
storing by the SAR the second ADC pedestal,
sampling by the ADC circuitry the image data from the first row against the second ADC pedestal stored in the SAR to obtain a second sampled input data, and converting by the ADC circuitry the second sampled input data from analog to digital to obtain a second ADC output value.

2. The method of claim 1, wherein the uncorrelated random numbers are uniformly distributed between 64 and 79.

3. The method of claim 1, wherein acquiring by the readout circuitry the image data from the first row further comprises:
selecting and amplifying by a scanning circuitry included in the readout circuitry the image data from the first row; and
transmitting the image data from the first row to the ADC circuitry.

4. The method of claim 1, wherein sampling by the ADC circuitry the image data from the first row to obtain the first and second sampled input data further comprises:
sampling the image data on a digital-to-analog (DAC) circuitry included in the ADC circuitry to obtain the first and the second sampled input data, respectively.

5. The method of claim 4, wherein converting by the ADC circuitry the first and the second sampled input data from analog to digital to obtain, respectively, the first and the second ADC output value further comprises:
performing a binary search using the DAC circuitry and the SAR.

6. The method of claim 5, wherein converting by the ADC circuitry the first and the second sampled input data from analog to digital to obtain, respectively, the first and the second ADC output values further comprises:
determining by a comparator included in the ADC circuitry to set or reset a plurality of bits stored in the SAR in succession from most significant bit (MSB) to least significant bit (LSB),
setting or resetting by the SAR each of the plurality of bits stored in the SAR based on the determination by the comparator to obtain the first and the second ADC output values, respectively, and
outputting from the SAR the first and the second ADC output values respectively to a function logic.

7. The method of claim 6, wherein converting by the ADC circuitry the first and the second sampled input data from analog to digital to obtain, respectively, the first and the second ADC output values further comprises:
resetting an inverting input of the comparator to a predetermined value during the sampling of the image data on the DAC circuitry to obtain the first and the second sampled input data, respectively.

8. The method of claim 7, wherein converting by the ADC circuitry the first and the second sampled input data from analog to digital to obtain, respectively, the first and the second ADC output values further comprises:
receiving and storing by a latch the comparator output values, and
selecting by a selector circuitry values outputted from the latch to be transmitted to the SAR.

9. The method of claim 8, further comprising:
receiving by the readout circuitry control signals from the logic circuitry, wherein the control signals control at least one of: the latch, the selector circuitry, a switch to receive the image data, a switch to reset the comparator, and a switch to reset the DAC circuitry.

10. The method of claim 9, further comprising:
generating by the readout circuitry a non-linearity error for each of the ADC output values respectively corresponding to the first and the second sampled input data and generating an average of the non-linearity errors; and
generating by the readout circuitry a final ADC output based on the first ADC output value and the second ADC output value.

11. A method of implementing Correlated Multi-Sampling (CMS) in an image sensor with improved analog-to-digital converter (ADC) linearity, the method comprising:
generating by the ADC circuitry a plurality of uncorrelated random numbers used as a plurality of ADC pedestals for sampling from the first row;
storing by a Successive Approximation Register (SAR) included in the ADC circuitry a different one of the ADC pedestals before each sampling of the image data;
sampling by an ADC circuitry included in a readout circuitry an image data from a first row a plurality of times against the plurality of ADC pedestals stored in the SAR to obtain a plurality of sampled input data; and
converting by the ADC circuitry each of the plurality of sampled input data from analog to digital, wherein converting by the ADC circuitry includes performing a binary search using the SAR.

12. The method of claim 11, wherein the uncorrelated random numbers are uniformly distributed between 64 and 79.

13. The method of claim 11, wherein sampling by the ADC circuitry further comprises:
sampling the image data on a digital-to-analog (DAC) circuitry included in the ADC circuitry to obtain the plurality of sampled input data.

14. The method of claim 13, wherein converting by the ADC circuitry includes:
performing the binary search using the DAC circuitry.

15. The method of claim 14, wherein converting by the ADC circuitry includes:
determining by a comparator included in the ADC circuitry to set or reset a plurality of bits stored in the SAR in succession from most significant bit (MSB) to least significant bit (LSB),
setting or resetting by the SAR each of the plurality of bits stored in the SAR based on the determination by the comparator to obtain ADC output values, and
outputting from the SAR the ADC output values to a function logic.

16. The method of claim 15, wherein converting by the ADC circuitry includes:
resetting an inverting input of the comparator to a predetermined value during the sampling of the image data on the DAC circuitry to obtain the plurality of sampled input data.

17. The method of claim 16, further comprising:
determining by the readout circuitry a non-linearity error for each of the ADC output values and generating an average of the non-linearity errors.

18. An imaging system comprising:
a color pixel array for acquiring image data, the pixel array including a plurality of rows and columns;
a readout circuitry coupled to the color pixel array to acquire an image data from a first row in the color pixel array, wherein the readout circuitry includes an analog-to-digital conversion (ADC) circuitry to:
  generate a plurality of uncorrelated random numbers used as a plurality of ADC pedestals for sampling from the first row;
  store in a Successive Approximation Register (SAR) included in the ADC circuitry a different one of the ADC pedestals before each sampling of the image data;
  sample the image data from the first row a plurality of times against the plurality of ADC pedestals stored in the SAR to obtain a plurality of sampled input data, wherein the image data is sampled on a digital-to-analog (DAC) circuitry included in the ADC circuitry, and
  convert each of the plurality of sampled input data from analog to digital, wherein converting by the ADC circuitry includes performing a binary search using the SAR and the DAC circuitry.

19. The imaging system of claim 18, wherein the uncorrelated random numbers are uniformly distributed between 64 and 79.

20. The imaging system of claim 18, wherein the ADC circuitry further comprises:
  a comparator to determine to set or reset a plurality of bits stored in the SAR in succession from most significant bit (MSB) to least significant bit (LSB), wherein the SAR sets or resets each of the plurality of bits stored in the SAR based on the determination by the comparator to obtain ADC output values.

21. The imaging system of claim 20, wherein converting by the ADC circuitry includes:
  resetting an inverting input of the comparator to a predetermined value during the sampling of the image data on the DAC circuitry to obtain the plurality of sampled input data.

22. The imaging system of claim 21, wherein the readout circuitry further determines a non-linearity error for each of the ADC output values and generates an average of the non-linearity errors.

* * * * *